United States Patent [19]

Dixon et al.

[11] 3,950,659

[45] Apr. 13, 1976

[54] METHOD OF PRODUCING TRANSDUCERS WITH PHASE, AREA AND DEPTH CONTROLLED POLARIZATION

[75] Inventors: Norman E. Dixon, Pasco, Wash.; William D. Jolly, San Antonio, Tex.

[73] Assignee: Battelle Development Corporation, Columbus, Ohio

[22] Filed: July 5, 1974

[21] Appl. No.: 485,352

Related U.S. Application Data

[63] Continuation of Ser. No. 340,346, March 12, 1973, abandoned.

[52] U.S. Cl. .................. 310/8; 310/8.1; 310/8.5; 310/9.5; 317/262 F
[51] Int. Cl.² ......................................... H01L 41/08
[58] Field of Search ............... 310/8, 8.1, 8.2, 2, 8.5, 310/9.5; 317/262 F

[56] References Cited
UNITED STATES PATENTS

| | | |
|---|---|---|
| 2,659,829 | 11/1953 | Baerwald .......................... 310/8.5 |
| 2,767,067 | 10/1956 | Prichard .......................... 317/262 F |
| 2,928,032 | 3/1960 | Daniel et al. .................... 317/262 F |
| 3,766,616 | 10/1973 | Stauote ............................ 310/8.2 X |

*Primary Examiner*—Mark O. Budd
*Attorney, Agent, or Firm*—Christensen, O'Connor, Garrison & Havelka

[57] ABSTRACT

A method for obtaining controlled depth, controlled area, and controlled phase polarization of a piezoelectric transducer element. A controlled phase bias voltage is applied to two generally opposing surfaces of the transducer element, and heat is then applied in a pulsed fashion to one of the two surfaces. By properly coordinating the phase of the bias voltage and the pulsed heating of the one surface, discrete layers of polarization may be created between the two surfaces, the phase, area and depth of the discrete layers being accurately controllable.

15 Claims, 10 Drawing Figures

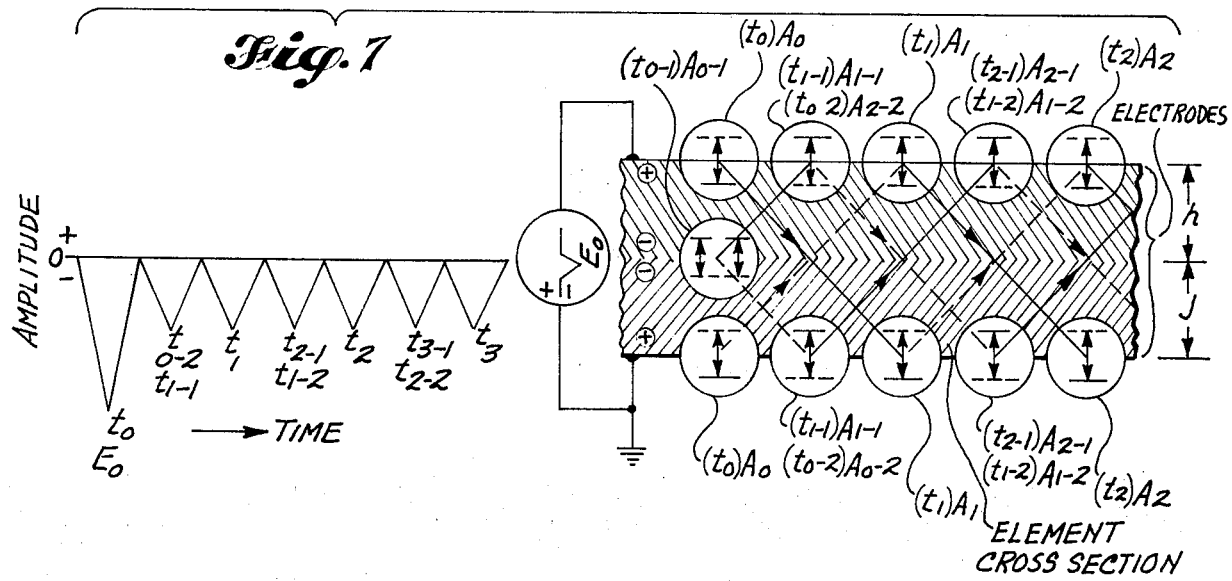
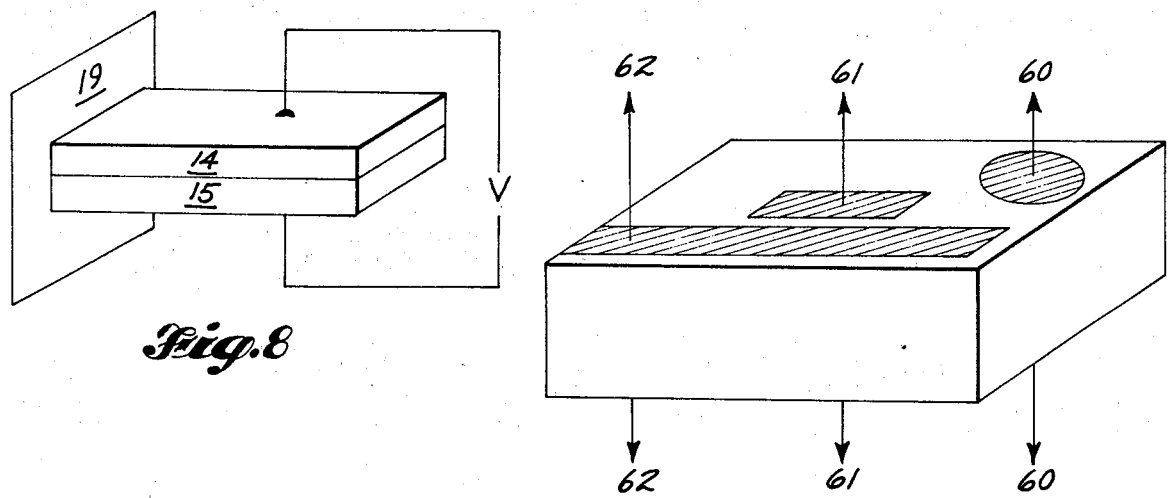
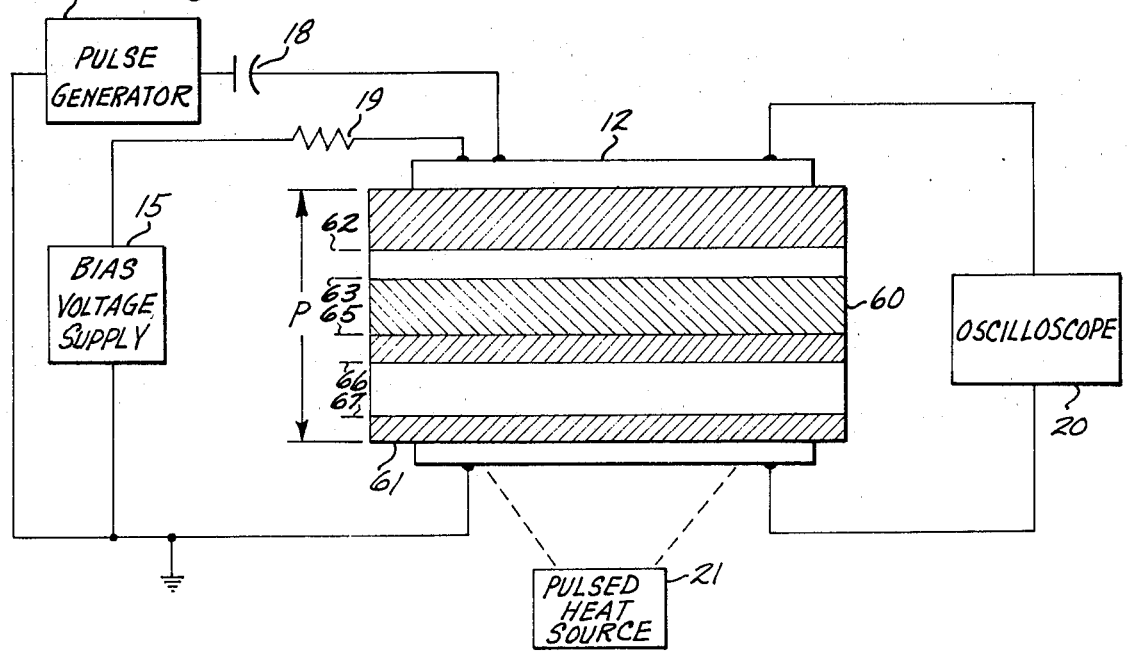

METHOD OF PRODUCING TRANSDUCERS WITH PHASE, AREA AND DEPTH CONTROLLED POLARIZATION

This is a continuation of application Ser. No. 340,346, filed Mar. 12, 1973, now abandoned.

BACKGROUND OF THE INVENTION

This invention relates generally to piezoelectric transducers, and more specifically to a method for creating multiple layers of polarization, each layer being controllable in phase and depth, between two surfaces of a surface active piezoelectric transducer element.

Heretofore, nearly all of the transducer elements which must be artificially polarized to produce a piezoelectric effect have been uniformly polarized in the thickness or lateral dimension of the element. Conventional transducers of this artificially polarized category, i.e., ferroelectric ceramic materials such as barium titanate or lead zirconate—lead titanate or lead metaniobate, are polarized completely or uniformly through the element in a direction parallel with the applied polarizing potential or bias voltage.

Polarization of such ferroelectric ceramics refers to the physical condition of the crystals of the material such that its magnetic dipoles are aligned in a given direction. A material may thus be polarized in one of two different directions, i.e., the magnetic dipoles of the material may be aligned in one of two opposing directions, or the material may be unpolarized, a condition wherein the dipoles are arranged in random directions with respect to one another.

Theoretically, polarization of such a material is accomplished by applying a strong electric field to the material, and coincidentally heating it to a temperature above its Curie point. When the material is heated above its Curie temperature, it loses its ferroelectric properties, and the electric field aligns the magnetic dipoles of the material to the direction of the applied field. Practically, however, the material is heated to a temperature slightly below its Curie point, during which time a strong electric field is applied to the material. The material is thus allowed to polarize over an extended period of time. With the electric field still applied to the material, it is slowly cooled to an ambient temperature. When the external field is then removed, a remnant polarization is retained in the material and the ferroelectric ceramic now will typically respond in a manner similar to that of other natural piezoelectric materials such as Rochelle salt or ammonium phosphate crystals.

The effect which the polarized ceramic exhibits is known as the piezoelectric effect, which refers to the material's capability of mechanically deforming in response to an applied electrical signal, and conversely, of storing an electric charge in response to a mechanical or acoustical excitation. By placing electrodes on opposing surfaces of the element, this stored charge may be released in the form of an electrical current, the value of which is a function of the applied mechanical or acoustical force. The polarized ferroelectric element, which exhibits this piezoelectric characteristic, is thus a true transducer, a device capable of converting or transforming directly between various forms of energy, in this case between mechanical or acoustical energy, and electrical energy.

Conventional transducers made from such polarized ferroelectric materials, however, have several distinct limitations, one of the most important being their incapability of producing a broadband response to excitation. For instance, all piezoelectric transducers have natural resonant frequencies, wherein the transducer element vibrates in a ringing fashion after it is struck with wave energy of a certain frequency. A conventional fully polarized transducer has both a natural mechanical resonant frequency, and at least one natural electrical frequency of resonance. The period of this natural resonant frequency will be equal to twice the velocity of the wave striking the element times the thickness of the element. If the element is excited by a one-quarter wave length or greater signal with respect to its period, the transducer will tend to ring, producing an undesirable output. This ringing response of a particular transducer will inherently limit the frequency range of adequate response to mechanical or electrical signals applied to it. Thus, the effective response frequency range of a conventional piezoelectric transducer is limited to those excitation frequencies which do not cause the transducer to respond in a ringing fashion. The conventional piezoelectric transducer is thus a narrow band transducer, and often rather limited in application.

Another significant limitation of current transducer technology is the inability to produce homogeneous transducer elements which may be partially polarized in their thickness direction, such that multiple layers of different phase, area, and depth of polarization may be achieved. For instance, it may be desirable to have bimorph or multimorph transducers which are comprised of multiple layers, each layer having a particular polarization in one direction or another, or alternatively being unpolarized. FIG. 8 shows a stacking of two such elements 14 and 15, the two elements being mounted on a stationary wall 19 and oppositely polarized. The application of a voltage to this configuration will cause the device to bend in one direction or the other, depending on the polarity of the voltage. This configuration is known in the art as a bender transducer. Other configurations or additional layers may be used to accomplish other results, such as high voltage generators.

Additionally, it may be desirable to have controllable surface area polarization so that multiple transducers could be present in a single element. Thus, different area polarization configurations, as well as phase and depth configurations, within a single element have specific practical applications.

Prior art transducer technology accomplishes this multimorph transducer structure by utilizing several distinct elements, polarizing them completely in one direction or another or maintaining them unpolarized, and then combining them in discrete layers and areas, as necessary to perform the desired function. This technique, of course, results in distinct interfaces between adjoining layers, and the inherent impedance mismatch at the layer interfaces often can create significant difficulties with respect to the desired response.

Various attempts have been made to dampen the ringing effect of the transducer due to its resonant frequencies discussed above. Some of these techniques include attaching a material of closely matching acoustic impedance to the back surface of the transducer element, epoxy bound casting of piezoelectric powders in the transducer element, sputtering of piezoelectric materials, and exercising some control over the shape of the driving function of the transducer. All of these methods and techniques attempt, in one fashion or another, to dampen the natural ringing response of the transducer, either by changing the structure of the transducer element itself, or by providing some specified acoustical backing material for the element. None of these techniques, however, result in a broad band transducer element. They are all basically subject to the ringing limitations mentioned above. They each produce transducers having a slightly enhanced response in certain frequency areas albeit in exchange for other disadvantages.

U.S. Pat. to Baerwald, No. 2,659,829, discloses a technique which bears to some extent on both of the significant problems noted above, but which itself has significant disadvantages. Baerwald discloses a technique of partially polarizing a ferroelectric ceramic material in its thickness direction, resulting in a transducer which is claimed to be inherently damped, and which has a polarized layer and unpolarized layer in the thickness direction. Baerwald utilizes the steps of first completely polarizing the element in one direction by means of known techniques, and then heating a portion of one surface of the polarized material to a temperature either close to or above the Curie temperature of the material for a sufficient length of time such that the polarization of that surface layer is destroyed. The application of the heat as described in Baerwald, however, does not appear to be controlled, as there are no limits specified with respect to the quantity of heat or the length of time that the heat is applied to the surface. There is no disclosure concerning the control of the respective depths of the polarized and unpolarized layers, and hence, the response of the transducer. This results in a transducer element having unpredictably different response characteristics.

Furthermore, the transducers disclosed are not capable of being utilized as either bimorph or multimorph structures. Rather, the technique is specifically directed to producing transducers wherein a certain portion of the transducer in its thickness direction may be depolarized, for purposes of impedance matching and damping off of the back surface of the transducer. Additionally, the transducers fabricated by the method described have proven in practice to be unstable in operation, and highly susceptible to fatigue and other damage.

In view of the above, it is a general object of the present invention to provide a method of polarizing ferroelectric elements which overcome the disadvantages of the prior art.

It is another object of the present invention to provide a method of polarizing a ferroelectric material to any desired depth between an opposing pair of element surfaces.

It is another object of this invention to provide a method for polarizing a ferroelectric material so as to produce a damped piezoelectric transducer.

It is a further object of the present invention to provide a method for polarizing a ferroelectric element such that discrete layers of polarization and nonpolarization may be achieved within a single ferroelectric element.

It is a further object of the present invention to provide a method for producing a polarized transducer element wherein the response of the transducer may be significantly damped within the transducer element itself.

It is a still further object of the present invention to provide a method for polarizing ferroelectric transducer elements in which the depth, area, and phase of multiple layers of polarization within a single ferroelectric element may be controlled. Other objects, features and advantages of the invention will become apparent as the description proceeds. A method for monitoring the polarization condition of the transducers made by the present invention is more fully covered in copending application entitled "Method of Controlling the Polarization Condition of Transducers" by Norman E. Dixon and is assigned to the same assignee as the present invention.

SUMMARY OF THE INVENTION

Briefly, in accordance with a preferred embodiment, the present invention generally includes steps of first placing two opposing faces of a ferroelectric transducer element at a common bias potential, secondly selectively heating, by means of a short duration pulse, a portion of one face of the element, which results in an element having a portion of its thickness which is affected by the heat pulses conditioned oppositely, as between polarization and nonpolarization, with respect to the remainder of the element in the specified direction, and third, terminating the heating, when the desired depth of heating effect is achieved. Additional combined heating, biasing and terminating steps can be performed, resulting in multimorph structures wherein the phase, area, and depth of the polarization of multiple layers may be accurately controlled.

DESCRIPTION OF THE DRAWINGS

A more thorough understanding of the invention may be obtained by a study of the following detailed description taken in conjunction with the accompanying drawings in which:

FIG. 7 shows the response of a double surfaced polarized transducer element to a single electrical triangle wave excitation signal, and the excitation period is less than or equal to the polarized layer periods.

FIG. 8 shows a bimorph structure of the prior art known as a bender transducer.

FIG. 9 shows a transducer element produced in accordance with the principles of the present invention multiple layers of polarization and nonpolarization in a single transducer element.

FIG. 10 shows a particular transducer area configuration.

DESCRIPTION OF THE PREFERRED EMBODIMENT

Figure 1:
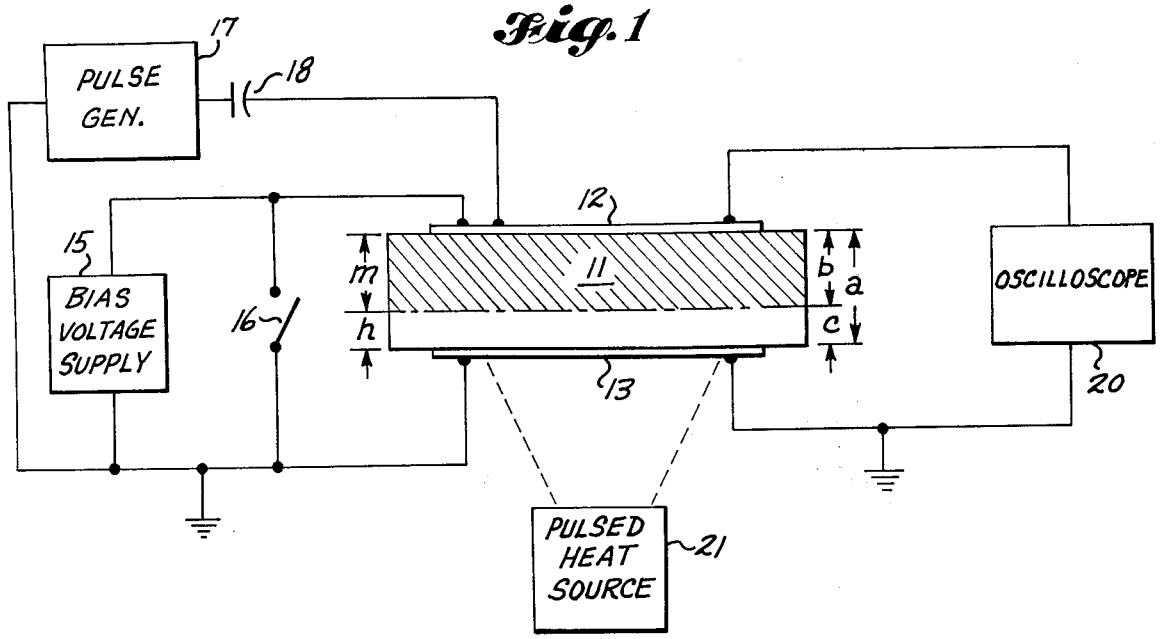
FIG. 1 shows the physical connection and apparatus necessary for accomplishing the steps of the present invention relative to a simple polarized-nonpolarized configuration of a transducer element.

Referring to FIG. 1, a general system for controlling the partial polarization of a piezoelectric transducer element is shown, in conjunction with apparatus for monitoring the partial polarization. Furthermore, the apparatus shown in FIG. 1 serves to demonstrate the technique by which multiple layers of controlled depth, controlled area, and controlled phase polarization in a single homogeneous ferroelectric element are produced.

Referring to FIG. 1, a ferroelectric ceramic element 11 is shown, having electrodes 12 and 13 connected to opposing faces in the thickness direction. For the purposes of explanation, the portion of the element 11 which is polarized in a given direction is shown by diagonal lines, and the portion of the element which is not polarized is shown by an absence of lining. Opposing diagonal lines indicate polarization in an opposite direction. The configuration shown in FIG. 1 represents the polarization state of the element after the technique to be described in the following paragraphs has been accomplished.

To accomplish partial polarization, a bias voltage supply 15 is connected across the two electrodes 12 and 13, which are attached to opposing surfaces of the element 11, and a switch 16 is provided to short the electrodes to ground. A pulse generator 17 in conjunction with a capacitor 18 and an oscilloscope 20 are also connected between the electrodes 12 and 13, for purposes of monitoring the depth of the effect of the pulsed heat source 21.

According to a first technique for partial polarization, the ferroelectric element 11 is first completely polarized in the thickness dimension $a$, so that its magnetic dipoles are arranged in one direction. This complete polarization in a given direction is accomplished in a well-known fashion by applying a strong electrical field of given polarity, heating the element to a given temperature below its Curie temperature, and allowing the material to slowly polarize, as explained earlier. The element is then slowly cooled to an ambient temperature while the electrical field is maintained, resulting in a completely polarized element in a given direction.

The electrodes 12 and 13 are then shorted together by use of the switch 16, which, when closed, places both electrodes at a common ground potential. The pulsed heat source 21 is then actuated. The heat source is concentrated such that a selected portion of the near surface of the transducer element is heated above the element's Curie temperature, hence destroying the polarization of the affected area. The area of depolarization, as well as the depth of depolarization, may be accurately controlled by controlling the magnitude, duration and repetition rate of the heat pulses. As shown in FIG. 1, this results in a transducer element having a layer or strip of unpolarized material of dimension $c$ at one surface of the element, the strip having an internal interface with a polarized layer of dimension $b$. The relative dimensions of $b$ and $c$ may be accurately controlled by the application of heat pulses as described above. This is thus one technique of varying the polarization condition of a single homogeneous transducer element in a given dimension between two generally opposing surfaces.

A second technique for creating partially polarized transducer elements utilizes a pulsed heat source to partially polarize an otherwise unpolarized element. Referring again to FIG. 1, the transducer element 11 is first completely depolarized in the $a$ dimension. Electrodes 12 and 13 are again attached to the transducer element 11, and a bias voltage supply 15 is connected to the element through the electrodes. Pulse generator 17, capacitor 18 and oscilloscope 20 are again utilized to monitor the depth of polarization achieved by the thermal pulses on the otherwise unpolarized element. The method of monitoring will be more fully explained in later paragraphs.

A polarization voltage bias, which determines the phase of the polarization, in accordance with standard polarization theory, is maintained on the element 11 via the voltage supply 15 through the electrodes 12 and 13. Thermal pulses are then applied to the unpolarized element 11 by means of pulsed heat source 21, as shown in FIG. 1, resulting in a polarized layer of dimension $n$ in the otherwise unpolarized element of dimension $m$. The thermal pulses are again controlled, in terms of magnitude, duration and repetition rate, such that a varying depth of the element is heated above or close to the element's Curie temperature, and in combination with the voltage bias on the surfaces results in a polarized layer of a given polarization, depending on the polarity of the bias voltage.

Since at some depth the temperature effect of the heating decays significantly below that of the Curie temperature of the element, the depth of polarization may be controlled by controlling the thermal pulses. For instance, a 4 mil depth of polarization may be obtained in lead zirconate–lead titanate ferroelectric material with a total of 10 heat pulses 1 minute apart, each pulse being 2 to 3 microseconds in duration, with a magnitude of 2 joules of energy.

By varying the amount of energy contained in the pulses, as well as the duration of the pulses, and the interval between the pulses, the depth of a given polarization with respect to the cross-sectional dimension of an otherwise unpolarized, or oppositely polarized element may be accurately controlled.

Referring to FIG. 9, a multimorph, or multilayer, transducer is shown which takes advantage of both of the techniques explained above, resulting in a structure which has multiple layers of polarization in a given direction of a transducer element, the depth, area, and phase of the polarization of the individual layers being accurately controlled by the pulsed heating and monitoring techniques of the present invention. This eliminates the need for multiple separate polarized or unpolarized layers which are then sandwiched together in some fashion to form a discrete whole transducer. Rather, the multipolarized transducer is produced from a single homogeneous transducer element, thereby eliminating the inherent impedance matching problems of the prior art due to discrete interfaces between differently polarized or nonpolarized regions.

Referring to FIG. 9, the transducer element shown generally at 60 may be initially completely polarized in a given direction, to a depth of dimension $p$. Thereafter, the portion of the transducer from surface 61 to boundary 62 may be depolarized by grounding the electrode connections as shown in FIG. 1 and applying sufficient heat. FIG. 9 shows the use of a resistor 19, which accomplished the same result as the closed switch 16 when the bias supply 15 is off, by establishing a closed leak circuit to ground from electrode 12. The depth of depolarization is monitored by the monitoring technique to be later described. At this point, a specified bias is applied to the electrodes, and heating applied again, to an extent that the portion of the element from surface 61 to boundary 63 will be polarized in a direction opposite to that of the first polarization.

At this point, the bias is reversed, and heat again applied, resulting in a first phase polarization from surface 61 to boundary 65.

The element surfaces are then placed at ground potential either in a switch or by the circuit shown in FIG. 9, and the surface 61 again selectively heated to a depth such that from surface 61 to boundary 66, the element is unpolarized. A bias is then applied to the electrodes and heat applied such that the portion of the element from surface 61 to boundary 67 is polarized, as shown. This results in a transducer having a polarization and depth configuration as shown in FIG. 9.

Furthermore, the surface area of a single transducer may also be accurately controlled. This allows multiple transducers each with its own phase and depth characteristics to be configured within a single piezoelectric transducer element. Referring to FIG. 10, an element is shown with three area configurations. Thus, leads 62-62 are attached to opposing faces of a rectangular transducer, leads 61-61 are attached to opposing faces of a squarish-shaped transducer, and leads 60-60 are likewise associated with a circular transducer. All three transducers have individual configurations of depth and phase of various layers through the element, and all three transducers located within a single homogeneous element. Significant design flexibility results from this control over depth and volume polarization of piezoelectric elements.

Thus, any combination of polarization phase, either in one direction or the other, or depolarized, and depth as well as area of a particular phase of polarization, may be accomplished in a single homogeneous transducer element, utilizing the techniques of the present invention. Any configuration of multimorph transducer may therefore be produced without the use of discrete, sandwiched construction.

The pulsed heating technique of the present invention, which results in multiple layers of controlled depth, controlled area and controlled phase polarization as described above, is also advantageous in that thermal pulses significantly reduce the high percentage of element fracture due to thermal stresses encountered in prior art techniques.

By utilizing the thermal pulse technique of the present invention, significant control over the depth of the individual polarized layers may be achieved. Although a pulsed laser heat source is useful for very thin strips, i.e., 0.001 inch, other forms of pulsed heating, such as shuttered quartz lamps, shuttered CW lasers and other methods of pulsed heating may be used effectively, especially for greater depths of polarization. Polarization depths of up to one inch and greater may be accomplished by any of the pulsed sources noted above.

Figure 2:
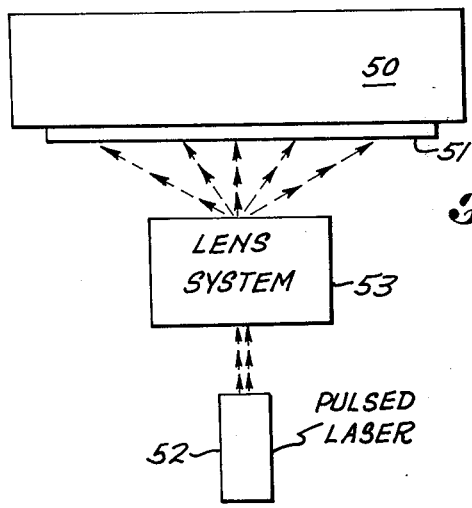
FIG. 2 shows a system for selectively heating one side of a transducer element by means of a laser apparatus.

The laser system of pulsed heating shown in FIG. 2 is of special interest because of the preciseness by which the heat pulses may be controlled. The laser system may either be a shuttered CW energy system, or a standard pulse laser. Typically, a pulsed laser 52 is utilized in conjunction with a lens system 53 to achieve a selected application of heat to the desired surface of the transducer element 50 through an electrode 51. This distribution can also be accomplished by stroboscopic manipulation. The distribution of the heat, of course, depends upon the configuration of the lens system. For instance, depending upon the shape of the transducer element, and the heat pattern desired in a particular application, the lens system may be used to evenly spread or disburse the laser heat over an extended area on the surface of the electrode 51, or it may be utilized to further focus the pulsed laser energy so that very small, discrete areas, lines, or geometric patterns of polarization may be achieved.

The laser 52 is typically high power, and is used in the pulse mode to obtain the desired result. The depth and phase of the polarization or depolarization of the transducer element achieved by the pulse laser in operation is controlled by the magnitude, duration, and interval, or the resulting thermal pulses, as well as the phase of the element bias voltage.

Referring now to FIGS. 3 through 7 the response of a transducer having various simple polarized-depolarized depth combinations will be examined and explained, so as to clarify the significance of the technique of the present invention, and so as to also clarify the method of monitoring the depth of the heating effect in polarization or depolarization. The principles of the monitoring technique, although explained with respect to rather simple polarized layer configurations, are, of course, equally applicable to the multimorph configurations made possible by means of the techniques previously explained.

During the application of the thermal pulses, pulse generator 17 in conjunction with capacitor 18 continuously applies electrical pulses to the element, and the oscilloscope 20 displays the response of the element to those pulses. The response of the element as shown by the scope 20 is in real time, and is dependent upon the actual depth and phase of depolarization or polarization of successive layers in the element. Thus, the thermal pulses may be terminated at the precise point when the desired polarization configuration of the transducer is reached.

Figure 3:
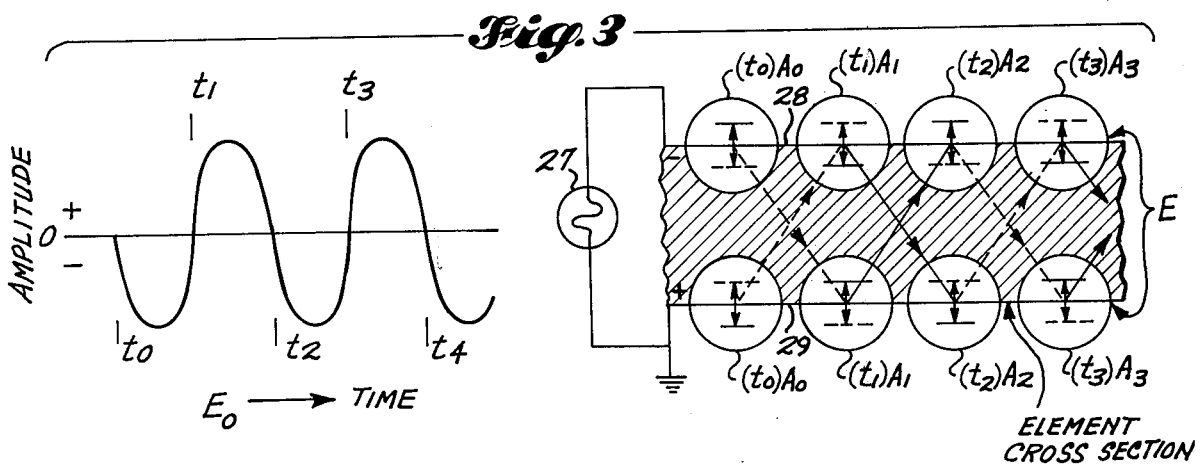
FIG. 3 shows the response of a completely polarized transducer to a sinusoidal excitation signal.

Referring to FIG. 3, a completely polarized transducer element 26 is shown having a source of electrical excitation 27, connected between opposing surfaces 28 and 29 of the element 26. The excitation is a continuous sinusoidal wave having a period $t_0$-$t_2$, the period of the waveform being related to the period of the element such that the element is ordinarily in resonance. The dotted lines in the element 26 refer to tension type waves which tend to expand the element, and the solid lines refer to compression type waves which tend to push the element in upon itself. The circled portions $A_0$, $A_1$, $A_2$ and $A_3$ refer to the excitation wave $A_0$ and the subsequent reflected wave pattern within the transducer at its two surfaces.

According to standard transducer theory, when a piezoelectric element is excited by such an electrical signal, a mechanical wave of a compression nature will be imparted at the boundaries or surfaces of the element, shown as $A_0$ in FIG. 3. This compression wave is transmitted through the element to the opposing surface, as shown, and then propagated or coupled through the boundary to the adjoining medium. At the polarized surfaces or boundaries of the element, however, a tension wave is reflected back into the element, since sound reflecting from a boundary of high-low acoustic impedance will be reversed in phase from the phase of the propagating wave. It is this reflected wave which is used to advantage in monitoring the polarization configuration of the element.

These alternating compression and tension reflected waves continue as long as there is excitation or until they die out due to natural or other damping. The transducer is thus said to "ring out" at its natural frequency. Thus, a completely polarized transducer element as shown in FIG. 3 can be detected by the monitoring device shown in FIG. 1 by observing on the oscilloscope this ringing response of the element. A continuously sinusoidal excitation signal will result in a sinusoidal ringing response by the element, the period of the response being determined by the natural period of the element.

Figure 4:
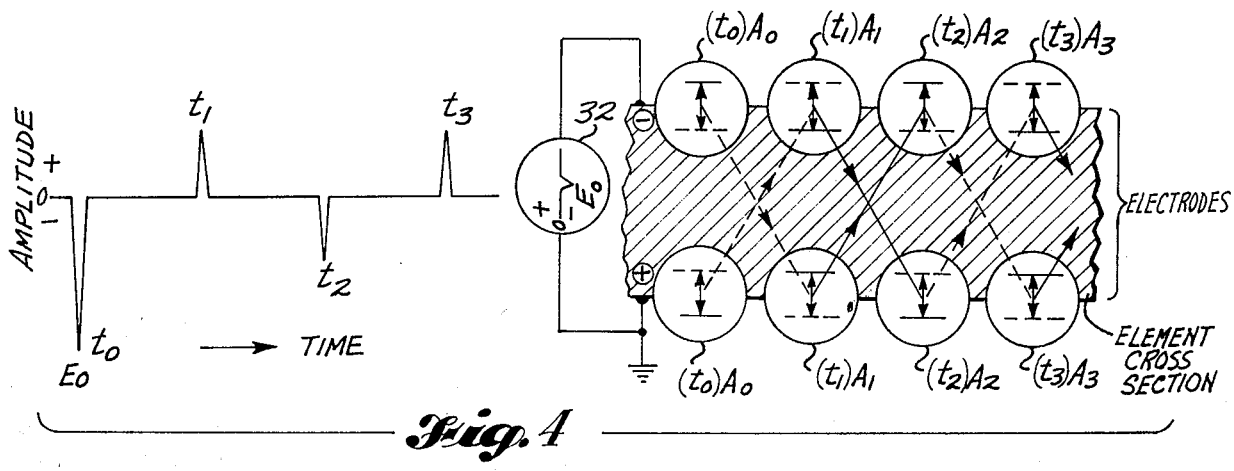
FIG. 4 shows the response of a completely polarized transducer element to a single electrical pulse.

Referring to FIG. 4, an identical transducer element 31, which is completely polarized in the cross-sectional view shown, is excited by a single pulse 32 of amplitude $E_0$ at time $t_0$. The response of the transducer, being fully polarized, is similar to that of the response to the sinusoidal signal. The initial pulse at $t_0$ will cause the transducer to respond with a mechanical wave, a compression wave being coupled to the adjoining medium, and a tension wave being reflected back into the transducer element, as shown by the dotted lines from $t_0$. The tension wave reaches the opposing surface of the element at time $t_1$, at which point the tension wave is coupled away from the element, and a compression wave is reflected back into the element, as shown by the solid line beginning at $t_1$. This ringing response, caused by the excitation of the single electrical pulse shown, will continue until it naturally dampens out. The period from $t_0$ through $t_1$, which is the time which the wave takes to proceed from surface to surface, is equal to the natural period of the transducer element, as determined by the velocity of the wave, and the thickness of the element.

Figure 5:
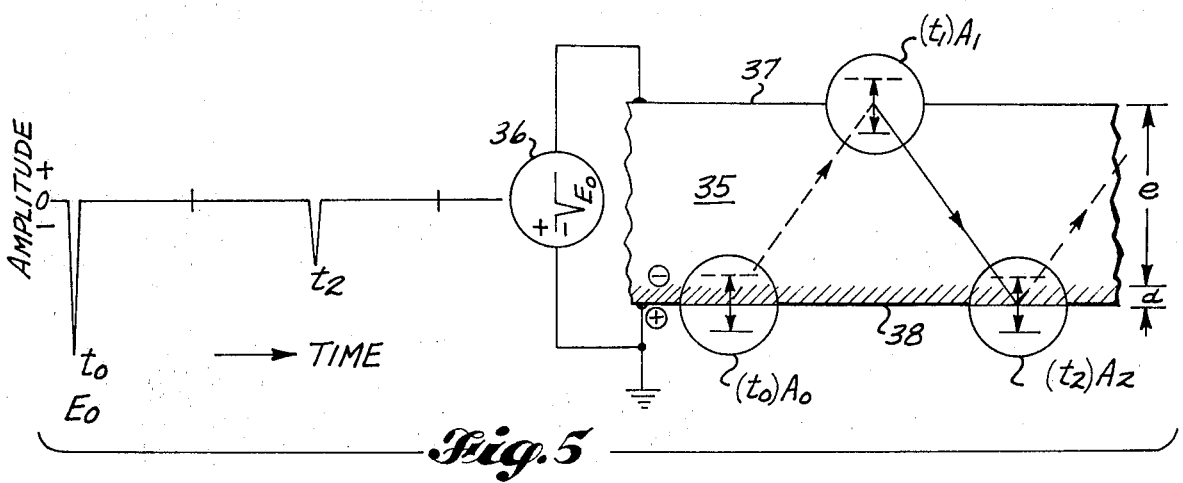
FIG. 5 shows the response of a thin strip partially polarized transducer element with respect to a single electrical pulse excitation signal, where the excitation waveform has a period greater than the polarized layer period.

Referring to FIG. 5, a transducer element is shown having a thin polarized portion $d$ with respect to an unpolarized portion $e$ in the cross-section dimension. This configuration may be produced by selective pulsed heating of one surface, while maintaining a short circuit to ground between the electrodes on the opposing surfaces.

When the transducer element 35 is depolarized sufficiently so that only a thin strip $d$ remains with respect to the unpolarized portion $e$, a very different transducer response from that of FIG. 4, showing a natural damping effect, results. A single electrical pulse of amplitude $E_0$ is again applied by a pulse generator 36 to the opposing surfaces of a transducer element 35, as shown in FIG. 5. The time period of the excitation waveform is greater than the period of the polarized layer. Because one surface 37 of the transducer element is completely depolarized, no initial pulse $A_0$ is seen at that surface. The initial pulse $A_0$ is present only at the polarized surface 38. A compression wave is coupled to the medium adjoining the transducer element, and a tension wave is reflected back into the element 35, as shown by the dotted lines beginning at time $t_0$. At back surface 37, a compression wave will be reflected at time $t_1$ back into the element to the opposing surface. Although the wave is reflected, no response of the transducer is seen by the monitor at this point, due to the surface being nonpolarized.

At surface 38, a portion of the wave will be coupled away, while a tensional wave will be reflected back to the other surface, as shown. Since surface 38 is polarized, a response will be present at time $t_2$ which is the reflected portion of the tension wave originating from surface 38 at time $t_0$ and reflected by surface 37 at time $t_1$. This response of surface 38 will continue until the wave is completely damped out. However, it can be seen that the ringing response of the transducer element shown in FIG. 4 is significantly reduced, as spikes at time $t_1$ and $t_3$ are entirely eliminated, due to the substantial depolarization of the element in the cross-sectional dimension.

Figure 6:
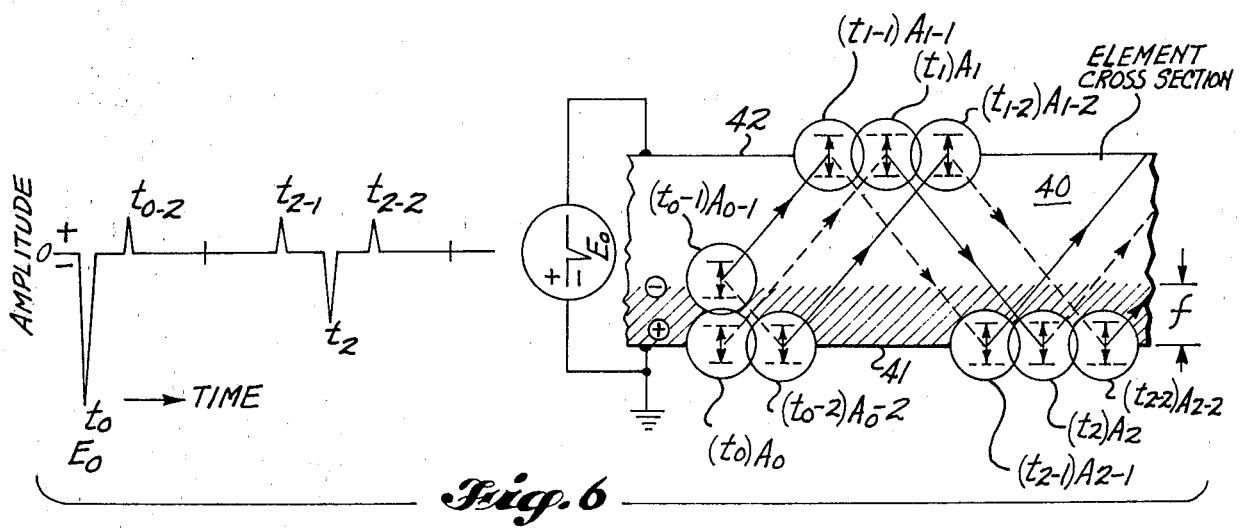
FIG. 6 shows the response of a thick partially polarized transducer element with respect to a single electrical pulse excitation signal, where the excitation period is less than one-half of the polarized layer period.

Referring to FIG. 6, a transducer element 40 partially polarized in the cross-sectional dimension is again shown, although the polarized portion $f$ is thick with respect to the duration of the pulse which is used to excite the element. Since the thickness of the polarized portion is long with respect to the pulse duration of the excitation pulse, multiple reflections take place at the various interfaces between the polarized portion and the unpolarized portion and at the element surfaces 41 and 42.

When the transducer element is excited by a pulse of amplitude $E_0$, and the period of the excitation wave is less than one-half of the period of the polarized layer, the element will respond with a mechanical wave from both faces of the polarized portion, sending a compression wave to the coupling medium, and reflecting a tension wave back into the element. This is shown at $(t_0) A_0$, and $(t_0) A_{0-1}$. Multiple reflections then take place off of the back surface 42 of the element, and surface 41. These waves will continue to reflect off both surfaces 41 and 42, creating a complex response as shown of compression and tension waves.

A transducer response will be noted whenever a wave, either compression or tension, reaches the polarized surface 41 of the transducer element. Therefore, at times $t_0, t_{0-2}, t_{2-1}, t_2$ and $t_{2-2}$, a response of the transducer will be noted. This conforms to the response diagram shown at the left in FIG. 6, where $t_0$ is the time of the excitation wave, and $t_2$ is the time of the reflected response from surface 42. The other spikes shown at $t_{0-2}, t_{2-1}$, and $t_{2-2}$ are the result of waves originating from the inner boundary 43 of the polarized portion or the element.

FIG. 7 shows a transducer element 45 which is polarized in two directions, that is, one-half of the cross-sectional dimension $h$ is polarized in one dipole direction, while the other portion $j$ of the transducer is polarized in the opposite direction. This results in a dual polarized element with a response to a triangle pulse of amplitude $E_0$ similar to that shown in FIG. 7. In this case, since the polarized layers are each equal to one-half the element thickness, and since they are oppositely polarized, the response noted at the element surfaces will be in terms of signal pulses of the same polarity as the excitation pulse, occurring with a frequency shown in FIG. 7.

The foregoing examples demonstrate that the response of the transducer, as recorded on the television monitor, is dependent upon the phase and depth of the polarization of individual layers of a single transducer element. Furthermore, by interrogating transducers with pulses of varying period with respect to the period of individual polarized layers, a continuous, and in many cases real time, monitor and control can be maintained on the polarization and volume of successive layers in the transducer, as those layers are being developed within the homogeneous element by the methods described earlier, such monitoring technique being more fully covered in the copending application referred to above.

Various desired controlled volume and phase polarization configurations thus may be obtained by monitoring each phase of the construction of the transducer and terminating individual steps when the desired response is observed on the oscilloscope. By thus utilizing the pulsed heating technique and the monitoring technique, accurate complex multimorph structures may be constructed from a single homogeneous piezoelectric element.

Although it is quite clear that a number of methods for applying heat to the surface of an element may be utilized to achieve the desired results, the use of thermal pulses, as disclosed by the present application, results in a broadband transducer element which is readily reproducible, stable in operation, and which has a low incidence of thermal fracture in manufacture. It is the application of heat in such controlled pulses, with respect to their magnitude, their duration, and their interval, which leads to such desirable results. Furthermore, the effect of the thermal pulses may be accurately and precisely monitored real time, by the use of a monitoring technique utilizing a pulse generator and an oscilloscope connected to the electrodes of the transducer element.

Although a preferred embodiment of the invention has been disclosed herein for purposes of illustration, it should be understood that various changes, modifications and substitutions may be incorporated in such embodiment without departing from the spirit of the invention as defined by the claims which follow:

What is claimed is:

1. A method for producing partially polarized piezoelectric transducers, wherein a polarization change is effected in a portion of a homogeneous ferroelectric element, comprising the steps of:

establishing an electric potential relationship between two generally opposed surfaces of said ferroelectric element;

generating a series of thermal pulses of controlled magnitude and rate, each of said thermal pulses individually containing a quantity of energy which is capable of producing a heating effect in said ferroelectric element substantially less than that required to effect a desired depth of polarization change in said ferroelectric element;

applying said series of thermal pulses to one of said opposed surfaces, said series of thermal pulses effecting a gradual polarization change inward of said ferroelectric element from said one surface thereof as said series of thermal pulses is applied to said one surface;

monitoring said polarization change simultaneously with the step of applying; and, terminating the step of applying when said polarization change advances to a first interior boundary in said ferroelectric element equal in depth to said desired depth of polarization change.

2. A method of claim 1, wherein said electric potential relationship is of a predetermined magnitude and polarity.

3. A method of claim 2, including the step of repeating the steps of establishing, generating, applying, monitoring and terminating using differing electric potential relationships, thereby forming successive interior boundaries, and hence successive regions of predetermined polarization condition between said first interior boundary and said one surface.

4. A method of claim 1, including the step of controlling the quantity of thermal energy applied to said one surface during a predetermined amount of time.

5. A method of claim 1, wherein the rise time of said thermal pulses is substantially instantaneous.

6. A method of claim 1, wherein said thermal pulses are generated and applied by a pulse laser.

7. A method of claim 1, wherein the magnitude of the electric potential relationship is other than zero between said two generally opposed surfaces.

8. A method of claim 1, wherein the magnitude of the electric potential relationship is zero.

9. A method of claim 1, wherein the electric potential relationship is selected variously from the group comprising: a potential of positive magnitude, a potential of negative magnitude, and a potential of zero magnitude.

10. A method of claim 3, wherein said homogeneous ferroelectric element initially has a preselected polarization condition, and wherein said first interior boundary and the other of said two opposed surfaces defines a first element layer, which first element layer retains the initial polarization condition of said ferroelectric element following the steps of establishing, generating, applying, monitoring and terminating.

11. A method of claim 1, wherein the step of generating includes controlling the magnitude, duration and repetition rate of said thermal pulses.

12. A method of claim 1, wherein the temperature gradient established in said ferroelectric element by a thermal pulse during the step of applying is permitted to return substantially to zero before the next successive thermal pulse is applied to said one surface.

13. A method of claim 12, wherein the duration of said thermal pulses is less than 15 milliseconds.

14. The method of claim 1, wherein said controlled rate is a uniform rate.

15. The method of claim 14, wherein said uniform rate is one pulse per minute.

* * * * *